(12) United States Patent
Iriarte et al.

(10) Patent No.: US 9,525,407 B2
(45) Date of Patent: Dec. 20, 2016

(54) POWER MONITORING CIRCUIT, AND A POWER UP RESET GENERATOR

(71) Applicant: Analog Devices Global, Hamilton (BM)

(72) Inventors: Santiago Iriarte, Valencia (ES); John A. Cleary, Limerick (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/204,851

(22) Filed: Mar. 11, 2014

(65) Prior Publication Data

US 2014/0266314 A1 Sep. 18, 2014

Related U.S. Application Data

(60) Provisional application No. 61/780,061, filed on Mar. 13, 2013.

(51) Int. Cl.
*H03K 5/153* (2006.01)
*H03K 5/24* (2006.01)

(52) U.S. Cl.
CPC .................................. *H03K 5/2472* (2013.01)

(58) Field of Classification Search
CPC ........ H03K 5/2481; H03K 5/249; H03K 5/08; H03K 5/24; G01R 19/16519
USPC ................................... 327/77, 142, 143, 198
See application file for complete search history.

(56) References Cited

U.S. PATENT DOCUMENTS

| | | | |
|---|---|---|---|
| 4,727,309 A | 2/1988 | Vajdic | |
| 5,422,563 A | 6/1995 | Pflueger | |
| 5,847,586 A * | 12/1998 | Burstein et al. | 327/143 |
| 6,137,324 A | 10/2000 | Chung | |
| 6,452,414 B1 | 9/2002 | Lorenz | |
| 6,472,912 B1 | 10/2002 | Chiu et al. | |
| 6,593,790 B2 * | 7/2003 | Kim | 327/198 |
| 6,650,154 B2 * | 11/2003 | Okuyama | 327/143 |
| 6,879,194 B1 | 4/2005 | Caldwell | |
| 6,894,544 B2 * | 5/2005 | Gubbins | 327/143 |
| 7,161,396 B1 * | 1/2007 | Zhou et al. | 327/143 |
| 7,426,146 B2 | 9/2008 | Aota | |
| 7,436,226 B2 * | 10/2008 | Kim | 327/143 |
| 7,450,359 B1 * | 11/2008 | Mei et al. | 361/92 |
| 7,808,387 B1 | 10/2010 | Kuhn | |

(Continued)

OTHER PUBLICATIONS

R. A. Blauschild, P. A. Tucci, R. S. Muller and R. G. Meyer, "A new NMOS temperature stable voltage reference", IEEE Journal of Solid-State Circuits, vol. SC-13, No. 6, Dec. 1978, pp. 767-774.

(Continued)

*Primary Examiner* — Quan Tra
(74) *Attorney, Agent, or Firm* — Knobbe, Martens, Olson & Bear, LLP

(57) ABSTRACT

A power supply monitoring circuit for monitoring a voltage at a power supply node compared to a reference node, the power supply monitoring circuit comprising a first field effect transistor and first and second voltage dropping components arranged in current flow communication between the power supply node and the reference node and each having first and second nodes, and wherein a first node of the first voltage dropping component is connected to one of the first and second nodes of the field effect transistor, and a gate of the field effect transistor is connected to the second node of the first voltage dropping component, and an output signal is taken from a connection made with the first field effect transistor.

25 Claims, 11 Drawing Sheets

(56) References Cited

U.S. PATENT DOCUMENTS

| | | | |
|---|---|---|---|
| 7,893,734 | B2 | 2/2011 | Garcia et al. |
| 8,049,483 | B2 | 11/2011 | Yamamoto |
| 8,212,545 | B2 | 7/2012 | Imura |
| 8,305,134 | B2 | 11/2012 | Hirose |
| 8,358,119 | B2 | 1/2013 | Kim |
| 8,519,782 | B2 | 8/2013 | Oyama |
| 2003/0052661 | A1 | 3/2003 | Tachimori |
| 2003/0098727 | A1* | 5/2003 | Okuyama ............ 327/143 |
| 2005/0073341 | A1* | 4/2005 | Lim ..................... 327/143 |
| 2006/0164136 | A1* | 7/2006 | Shin .................... 327/143 |
| 2010/0072972 | A1 | 3/2010 | Yoshikawa |
| 2010/0109742 | A1* | 5/2010 | Honda ................. 327/333 |
| 2010/0327842 | A1 | 12/2010 | Seok et al. |
| 2011/0068829 | A1* | 3/2011 | Ogawa et al. ......... 327/64 |
| 2011/0074470 | A1* | 3/2011 | Sanborn et al. ....... 327/143 |
| 2012/0092047 | A1* | 4/2012 | Chen et al. ........... 327/143 |
| 2012/0117410 | A1 | 5/2012 | Jeong et al. |
| 2012/0229183 | A1* | 9/2012 | Lee ...................... 327/143 |
| 2014/0266140 | A1 | 9/2014 | Iriarte et al. |

OTHER PUBLICATIONS

H. J. Oguey and B. Gerber, "MOS voltage reference based on polysilicon gate work function difference", IEEE Journal of Solid-State Circuits, vol. SC-15, No. 3, Jun. 1980, pp. 265-269.

H.-J. Song and C.-K. Kim, "A temperature-stabilized SOI voltage reference based on threshold voltage difference between enhancement and depletion NMOSFETs", IEEE Journal of Solid-State Circuits, vol. 28, No. 6, Jun. 1993, pp. 671-677.

S. Adriaensen, V. Dessard, D. Flandre, "25 to 300° C. ultra-low-power voltage reference compatible with standard SOI CMOS process", Electronics Letters, vol. 38, No. 19, Sep. 12, 2002, pp. 1103-1104.

X. Xia, et al., "Temperature-stable voltage reference based on different threshold voltage of NMOS transistors", IET Circuits, Devices & Systems, vol. 3, iss. 5, 2009, pp. 233-238.

M. Seok, et al., "A portable 2-transistor picowatt temperature-compensated voltage reference operating at 0.5 V", IEEE Journal of Solid-State Circuits, vol. 47, No. 10, Oct. 2012, pp. 2534-2545.

A. Katyal and N. Bansal, "A Self-Biased Current Source Based Power-On Reset Circuit for On-Chip Applications", 2006 International Symposium on VLSI Design, Automation and Test, IEEE, 2006, pp. 1-4.

T. Tanzawa, "A process—and temperature-tolerant power-on reset circuit with a flexible detection level higher than the bandgap voltage", IEEE International Symposium on Circuits and Systems, 2008, pp. 2302-2305.

Zhang, et al., "Design of a Novel Power-on-Reset Circuit Based on Power Supply Detector", International Conference on Scalable Computing and Communications; Eighth International Conference on Embedded Computing, IEEE, 2009, pp. 355-359.

\* cited by examiner

# POWER MONITORING CIRCUIT, AND A POWER UP RESET GENERATOR

TECHNICAL FIELD

The present disclosure relates to electronic circuits and, more particularly, to a power monitoring circuit and a power up reset generator.

BACKGROUND

Power up reset generators are known in order to monitor the evolution of a power supply to a circuit during power up. As the power supply voltage increases, logic elements in the circuit may latch into ill-defined and undesirable states. It is therefore known to provide a reset signal as soon as the power supply has become sufficiently established such that the circuit can start from a known initial condition, or to keep a reset signal in an active state until the power supply has reached a minimum acceptable value.

Power up reset circuits are known, for example, in US 2012/0117410 where, as described in its abstract, a current mirror is configured to supply a first current to a first line and a second current to a second line, and a comparator voltage generator is configured to generate a voltage using the first current provided by the first line. A driver is connected to the second line and configured to activate a reset signal in response to a voltage on the second line. A ground selecting transistor is further arranged to connect the second line and the ground line together in response to the comparator voltage. A problem with such a circuit is that it draws current through both limbs of the current mirror once the supply voltage has become established and, since the power up reset circuit is continuously on, is an unnecessary waste of power.

SUMMARY

According to a first aspect there is provided a power supply monitoring circuit for monitoring a voltage at a power supply node compared to a reference node, the power supply monitoring circuit comprising a first field effect transistor and first and second voltage dropping components arranged in current flow communication between the power supply node and the reference node. Each of the first field effect transistor and first and second voltage dropping components have first and second nodes. The first node of the first voltage dropping component is connected to one of the first and second nodes of the first field effect transistor. A gate of the first field effect transistor is connected to the second node of the first voltage dropping component. An output signal, such as an output voltage, may be taken from a connection made with the first field effect transistor.

In some embodiments the first field effect transistor is a "native" N-type field effect transistor (FET), such as an NMOS FET, or a JFET which can conduct a drain current when its gate is at about the same voltage as its source. The first voltage dropping component is a resistor having its first node connected to the gate of the first field effect transistor, which may be a native N-type FET. A depletion mode transistor may also be used. In general, the term "native transistor" should encompass a transistor able to conduct when a gate-to-source voltage $V_{gs}$ equals zero, and includes depletion mode devices.

In some embodiments the drain of the native N-type FET is connected to the power supply node and the first node of the first voltage dropping component is connected to the source of the FET. In this case the first node of the second voltage dropping component is connected to the second node of the first voltage dropping component, and the second node of the second voltage dropping component is connected to the reference node; and an output node is connected to the gate of the field effect transistor. The second voltage dropping component may be a resistor or an N-type transistor, or a bipolar transistor, or a diode which may include a diode connected transistor.

In some embodiments the second voltage dropping component is connected between the power supply node and the drain of the NMOS FET, and the output node is connected to the drain of the native NMOS FET. The second voltage dropping component may be a resistor or a P-type FET, or a bipolar transistor, a diode or a diode connected transistor.

In some embodiments the first transistor is a P-type FET such as a PMOS FET, having it source connected to the power supply node, the first voltage dropping component is a resistor having its first node connected to the drain of the P-type FET and its second node connected to the gate of the P-type FET, the second voltage dropping component is between the second node of the resistor and the reference node, and an output node is connected to the drain of the PMOS FET. The second voltage dropping component may be a resistor or an N-type FET (such as an NMOS FET) or bipolar transistor.

In some embodiments the FET is a normal N-type FET (a FET having a threshold voltage greater than zero volts and often referred to as being an enhancement mode device), the second voltage dropping component is connected between the power supply node and the first voltage dropping component, and the first voltage dropping component is connected to a drain of the N-type FET. An output node is connected to the drain of the N-type FET.

The second voltage dropping component may be a resistor or a PMOS FET.

The output voltage may be provided to an input of an inverter which has a switching voltage at substantially $V_{DD}/2$. An output of the inverter may be used to vary the resistance in the power supply monitoring circuit so as to provide hysteresis, for example, by modifying the operation of a transistor in a current flow path to provide hysteresis.

BRIEF DESCRIPTION OF THE DRAWINGS

Embodiments will now be described, by way of non-limiting example only, with reference to the accompanying drawings in which.

DETAILED DESCRIPTION OF EXAMPLE EMBODIMENTS

FIGS. 1a to 1d show variations of a power up monitoring circuit, each of which comprises a first transistor, which in these examples is a "native" N-type FET, such as a NMOS FET, together with a first voltage dropping component in the form of a resistance providing component, such as a resistor connected to the first transistor, and a second voltage dropping element which may be a second resistor or a second transistor.

Figure 1A:
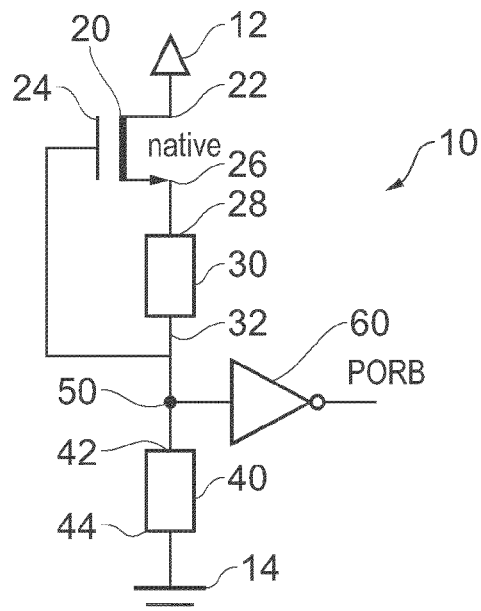
FIGS. 1a to 1d show first to fourth power supply monitoring circuits having a native transistor therein.

Starting with FIG. 1a, the power supply monitoring circuit, generally indicated 10, is connected between a power supply node 12 and a reference node 14. The power supply node 12 may be a positive voltage rail derived from a voltage regulator or a DC-to-DC converter or a battery. This may, in use, constitute a positive supply $V_{DD}$ to a logic circuit. The second or reference node 14 may be a local ground or the zero or negative supply rail $V_{SS}$ to a logic circuit.

The function of the power monitoring circuit 10 is to monitor the evolution of the voltage at the first node 12 during a switch on phase for a circuit which may be powered by, for example, a voltage regulator such as a switched mode supply. Thus following a switch on event, the voltage at the node 12 will rise with respect to the voltage at the node 14.

Figure 3:
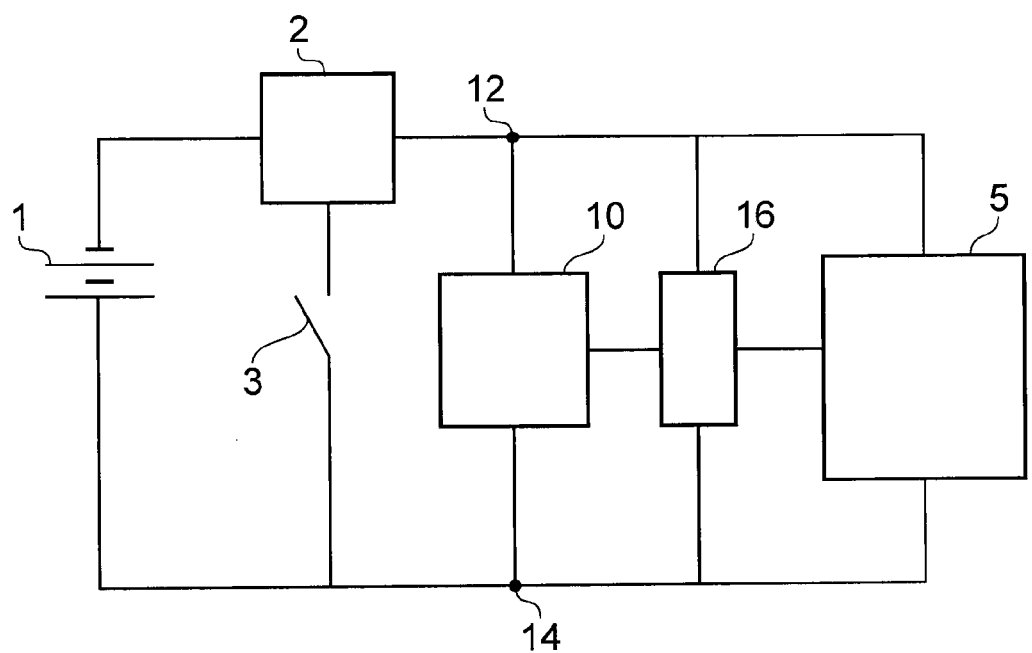
FIG. 3 shows an electronic apparatus including a power on monitoring circuit.

To put the operation of a power up reset circuit in context, consider an item of battery operated equipment as shown in FIG. 3.

A battery 1 is connected to a DC to DC converter 2 which may step up the battery voltage, or step down the battery voltage (or possibly both) depending on the evolution of the battery voltage as it discharges. The DC to DC converter 2 may be responsive to a user operated switch 3 and/or a soft switch. The output from the DC to DC converter 2 is provided to a circuit 5 (such as a logic circuit) that performs the task that the battery operated equipment is designed to perform, as well as to the power on voltage monitor circuit 10, and possibly a non-resettable monostable 16 that transforms the output of the power on monitor circuit 10 into a short pulse for provision to a reset line of the circuit 5. The reset line is typically active when 'low'. In some circuits the power up monitoring circuit 10 may be arranged to hold the reset low until the supply has become established, in which case the monostable 16 may be omitted. One or more inverters may act on the output of the power on voltage monitor circuit 10 to convert the signal polarity such that it is suitable for providing a reset signal when the supply voltage is below a threshold value. Thus, in many embodiments the monostable 16 is not required.

Referring back to FIG. 1a, the power supply monitoring circuit 10 comprises a first transistor 20 having a drain 22, a gate 24 and a source 26. The source 26 of the first transistor 20 is connected to a first node 28 of a first resistor 30. A second node 32 of the first resistor 30 is connected to the gate 24 of the first transistor 20. The drain 22 of the first transistor 20 is connected to the supply node 12. A second resistor 40 having first and second nodes 42 and 44 is connected such that the first node 42 of the second resistor 40 is connected to the second node 32 of the first resistor 30, and such that the second node 44 of the second resistor 40 is connected to, or is in current flow communication with, the reference node 14.

An output node 50 is formed at the connection between the first resistor 30, the second resistor 40 and the gate 24 of the first transistor 20. The output may then be sent to an inverter 60. The inverter 60 may have a switching threshold at substantially half the voltage difference between the voltage at the supply node 12 and the voltage at the reference node 14.

The illustrated first transistor 20 is a transistor that can conduct when its gate is at the same voltage as its source. The transistor 20 may be a depletion mode transistor or a native transistor. Such transistors are identified in the accompanying figures by use of thicker shading between the source and drain terminals.

For a native N-type FET the transistor 20 can conduct when the gate is negative with respect to the source of the device, although the drain current decreases as the gate voltage gets progressively more negative than the source voltage. The same applies to a depletion mode device.

In use, as the voltage at the power supply node 12 rises above that of the reference node 14, then the first transistor 20 starts to conduct. The voltage at the output node 50 is initially close to that as set by the potential divider formed by the first and second resistors 30, 40 having resistances R1 and R2 respectively. However, once the supply voltage has exceeded a few tenths of a volt, the transistor 20 starts to act as a current source because of feedback loop involving the first resistor 30 between the gate 24 of the transistor 20 and the source 26 of the transistor 20. Thus the current becomes notionally constant, and hence the voltage $V_{50}$ at node 50 becomes $$V_{50}=I*R2$$

where I is the current through the first transistor 20 acting as a current source, and R2 is the resistance of the resistor 40.

Meanwhile the switching point of the comparator remains at approximately $V_{supply}/2$ where $V_{supply}$ is the instantaneous voltage at the supply node 12. Therefore the switching threshold increases at the supply voltage rises, but the voltage at the node 50 remains substantially fixed.

As a consequence at some point the switching threshold will transition across the voltage at the output node 50, and the inverter 60 will have a transition at its output which can be used to drive a reset signal or to release a reset signal, as appropriate.

Figure 1B:
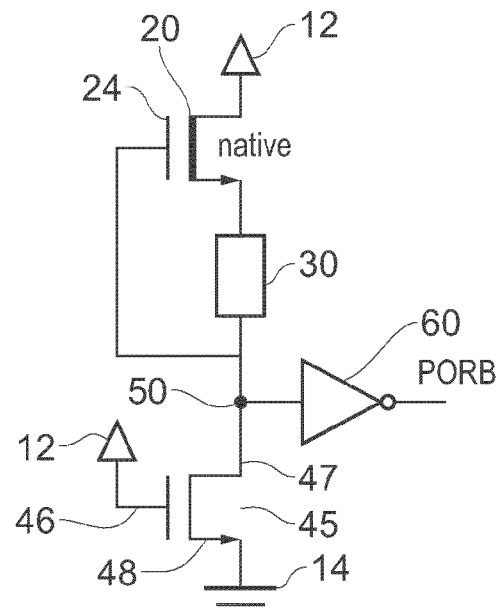

The circuit of FIG. 1b is similar to that of FIG. 1a, except that the second resistor 40 has been replaced with a second transistor 45, having a gate 46, a drain 47 and a source 48. The second transistor is a normal N-type device. Normal in this context refers to a transistor that is substantially non-conducting when a voltage at its control terminal is at the same voltage as an appropriate one of its current flow terminals. Such devices may be known as enhancement mode devices. The gate 46 is connected to the supply node 12.

As the power on monitoring circuit 10 powers up, the first transistor 20 rapidly establishes itself as a current source. Meanwhile the second transistor 45 is initially only weakly conducting so the voltage at output node 50 is quite close to that of the instantaneous supply voltage. Meanwhile, as before, the switching voltage of the inverter 60 is approximately half of the instantaneous supply voltage. The instantaneous supply voltage rises towards its nominal operating value as the supply becomes established.

As the supply voltage rises, the second transistor 45 becomes more conducting. Thus the voltage at output node 50 ceases to track the supply voltage, and gets pulled closer to that of the reference node 14. This causes the voltage at output node 50 to transition across the switching threshold of the inverter 60. This causes the inverter output to transition from low to high, releasing the power on reset (active low) signal PORB.

Figure 1C:
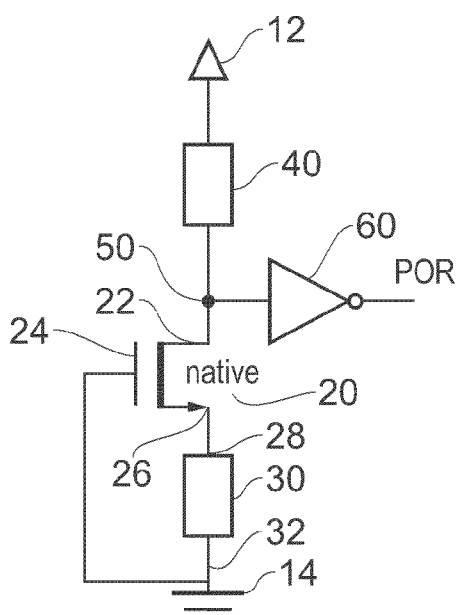

FIG. 1c is similar to FIG. 1a, in that the first transistor 20 and the first resistor 30 still form a feedback loop such that they act as a current source, or more strictly in this example as a current sink. However now the gate 24 of the first transistor 20 and the second node 32 of the first resistor 30 no longer form an output node, and may be connected to the reference node 14 either directly as shown or possibly through an intermediate component such as a further resistor, diode or transistor. The second voltage dropping element, in the form of the second resistor 40 is connected between the supply node 12 and the drain 22 of the first transistor 20. This connection also forms the output node 50.

As the supply voltage rises, the current sink formed the first transistor 20 rapidly becomes established, and the voltage $V_{50}$ at the output node 50 becomes $$V_{50} = V_{supply} - IR2$$

where R2 is the resistance of the second resistor 40, and I is the current generated by the current sink formed by the first transistor 20 and the first resistor 30.

Meanwhile the switching threshold of the inverter 60 is likely to vary with the supply voltage, and probably as $V_{supply}/2$, so that the supply voltage at output node 50 and the inverter switching voltage vary such that they cross each other as the supply voltage increases, thereby causing the inverter output to transition from one logic state to another.

Figure 1D:
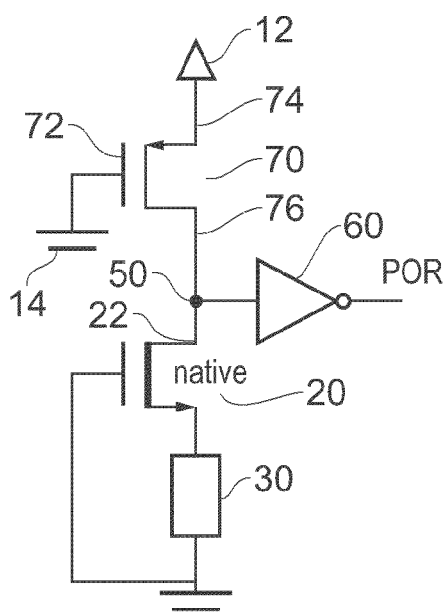

FIG. 1d shows a variation on the arrangement shown in FIG. 1c. The second resistor 40 has been replaced by a second transistor 70, which in this example is a PMOS device having a gate 72 connected to the reference node 14, a source 74 connected to the power supply node 12, and a drain 76 connected to the drain 22 of the first transistor 20.

As the supply voltage rises, the second transistor 70 may initially be weakly conducting, whereas the first transistor 20 is more strongly conducting from the outset, so the voltage at output node 50 is low compared to the instantaneous supply voltage. The first transistor 20 rapidly establishes its operation as a current sink. As the supply voltage rises, the voltage difference between the gate 72 and the source 74 of the second transistor 70 increases, and it passes more and more current, causing the voltage at output node 50 to rise towards that of the supply node 12. This causes a transition at the inverter 60, causing its output to go low, which may be used to initiate a power up reset, or which may be fed through a further inverter so as to release an active low power up reset.

Turning to the arrangements shown in FIG. 2, these are in many ways similar to those shown in FIG. 1. However in FIGS. 2a and 2b the first transistor is now a P-type device (such as a PMOS device), and has been designated as 80, whereas in FIGS. 2c and 2d it is an N-type device designated 90 (such as an NMOS device).

Figure 2A:
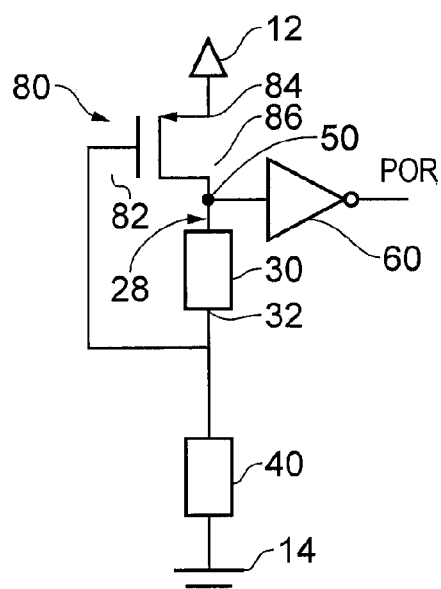
FIGS. 2a to 2d show fifth to eighth power supply monitoring circuits utilizing PMOS or NMOS transistors to form self-starting monitoring circuits.

Referring to FIG. 2a, the first transistor 80 is a PMOS device having a gate 82, a source 84 and a drain 86. The drain 86 is connected to a first node 28 of the first resistor 30, and a second node 32 of the first resistor 30 is connected to the gate 82 of the first transistor 80, and also to the reference node 14 by way of a second voltage dropping component, which in the arrangement of FIG. 2a is a second resistor 40. An output node 50 is formed at the drain 86 of the first transistor 80.

In use, as the voltage rises from zero the transistor 80 is substantially non-conducting. Thus substantially no current flows through the first and second resistors 30 and 40, respectively, and hence the gate 82 of the first transistor 80 and the output node 50 are both at a low, nominally zero, voltage. Meanwhile the transition (switching) threshold of the inverter 60 rises as the instantaneous supply voltage increases.

As the gate 82 of the transistor 80 becomes increasingly more negative than the source 84, the first transistor 80 becomes progressively more conducting, and the voltage at node 50 rises. The resistors 30 and 40 are chosen such that the voltage at node 50 will cross the transition (switching) threshold of the inverter 60 once the supply voltage has exceeded a minimum operating level for the circuits being powered by the power supply. Thus at some point the output of the inverter 60 will transition to low, so as to initiate a reset signal from, for example, a monostable, or it may be inverted by a further inverter.

Figure 2B:
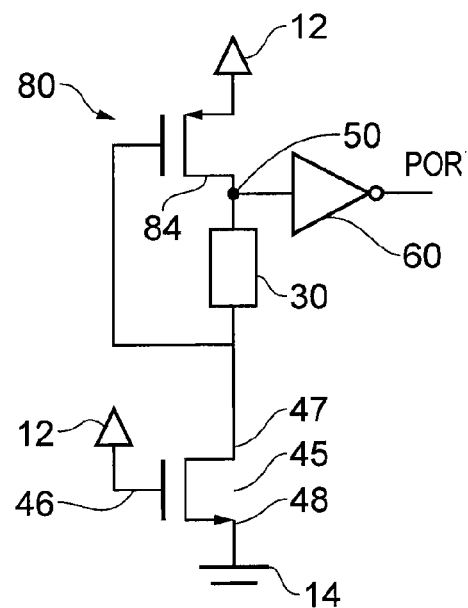

The circuit of FIG. 2b is similar to that of FIG. 2a, except that the second resistor 40 has been replaced by a second transistor 45, which is an NMOS device. The gate 46 of the second transistor 45 is connected to the power supply node 12. The drain 47 of the second transistor is connected to the second node of the first resistor 30, and the source 48 of the second transistor is in current flow communication with, and preferably connected to, the reference node 14.

In use, as the power supply voltage builds both the first and second transistors 80 and 45, respectively, are weakly conducting. As the power supply voltage rises, the gate-source voltage of the second transistor 45 rises, causing it to become more conducting, thereby pulling the gate voltage of the first transistor 80 low with respect to the source 84 of the first transistor 80, causing the first transistor 80 to conduct, thereby pulling the output node 50 up to the supply voltage. The resistance of the resistor 30 as set by the resistivity and the dimensions of the resistor 30, and the relative dimensions (e.g., widths) of the transistors, are selected such that the output voltage at output node 50 initially stays less than the switching threshold of the inverter 60 until the power supply has reached a minimum acceptable value.

Figure 2C:
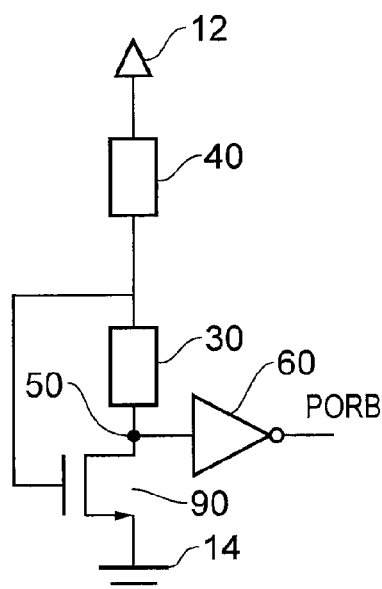

The circuit shown in FIG. 2c is similar to the circuit of FIG. 2a except that the first transistor 90 is now connected to the reference node 14 and the second resistor 40 is now connected to the power supply node 12. As part of this change, the first transistor 90 has become an N-type transistor, such as an NMOS device.

In use, as the power supply voltage rises, the first transistor 90 starts by being substantially non-conducting and hence the voltage at output node 50 tracks the voltage at supply node 12. As the supply voltage rises, the first transistor 90 becomes conducting and the voltage at output node 50 reduces. As it does so the supply voltage crosses the switching threshold of the inverter 60, triggering a change in the inverter output.

Figure 2D:
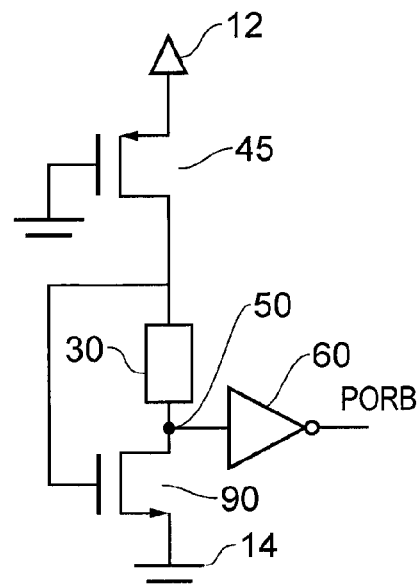

Similarly, the circuit of FIG. 2d is the mirror image of that shown in FIG. 2b. So the first transistor 90 now has its source in current flow communication with the reference node 14, and is an NMOS device. The second transistor 45 now has its source connected to the power supply node 12, its gate connected to the reference node 14 and is a PMOS device.

In use, and as the supply voltage rises the second transistor 45 becomes increasingly conducting, and in so doing it pulls the gate voltage of the first transistor 90 towards the supply rail. This pulls output node 50 towards the voltage of the reference node 14, and in so doing causes it to pass through the transition threshold of the inverter 60.

The value of the resistor 30 may be in the order of several MΩ and thus, when driven from a 3.6 volt supply, current flowing through the resistor 30 may be of the order of 1 μA.

Figure 4:
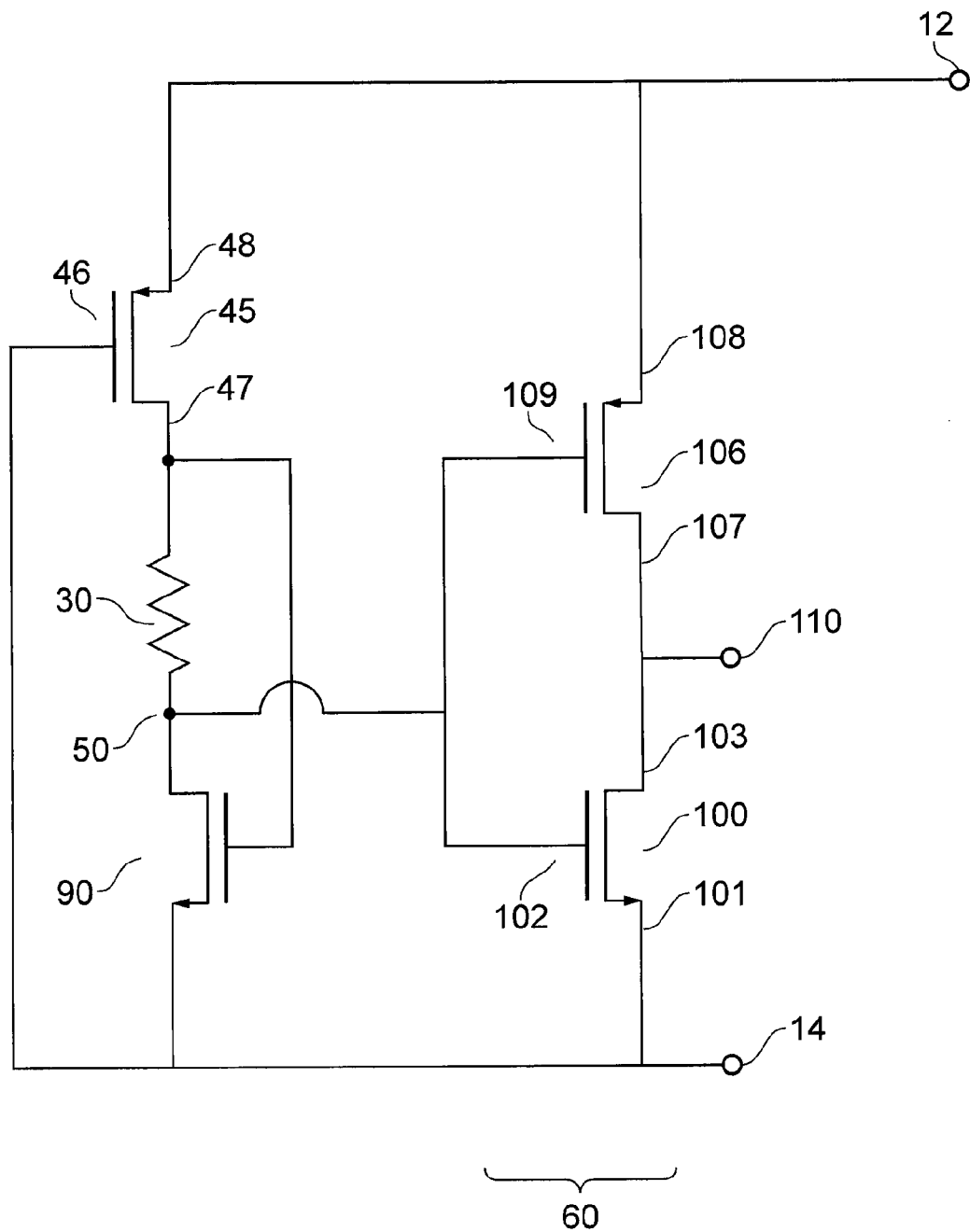
FIG. 4 is a schematic diagram showing a modification to the circuit shown in FIG. 2d.

FIG. 4 shows the circuit of FIG. 2d in greater detail, and explicitly shows the formation of the inverter 60 by virtue of the provision of third and fourth series connected field effect transistors 100 and 106. Third transistor 100 is an N type device having its source 101 connected to the reference node 14, a gate 102 connected to output the node 50, and a drain 103 connected to a drain 107 of the fourth field effect transistor 106. A source 108 of the fourth field effect transistor 106 is connected to the supply node 12, and it has a gate 109 connected to the output node 50. The fourth transistor 106 is a P type device.

An inverter output node 110 is formed at the connection between the sources of the third and fourth transistors 100, 106. In general, as evident from the circuit diagram, only one of the third and fourth transistors 100, 106 should be in a low impedance state between its drain and source (i.e. conducting) at any given time.

The inventors have realized that improved accuracy in terms of the transition voltage of the inverter 60 can be achieved when the third transistor 100 is matched with the first transistor 90.

Figure 5:
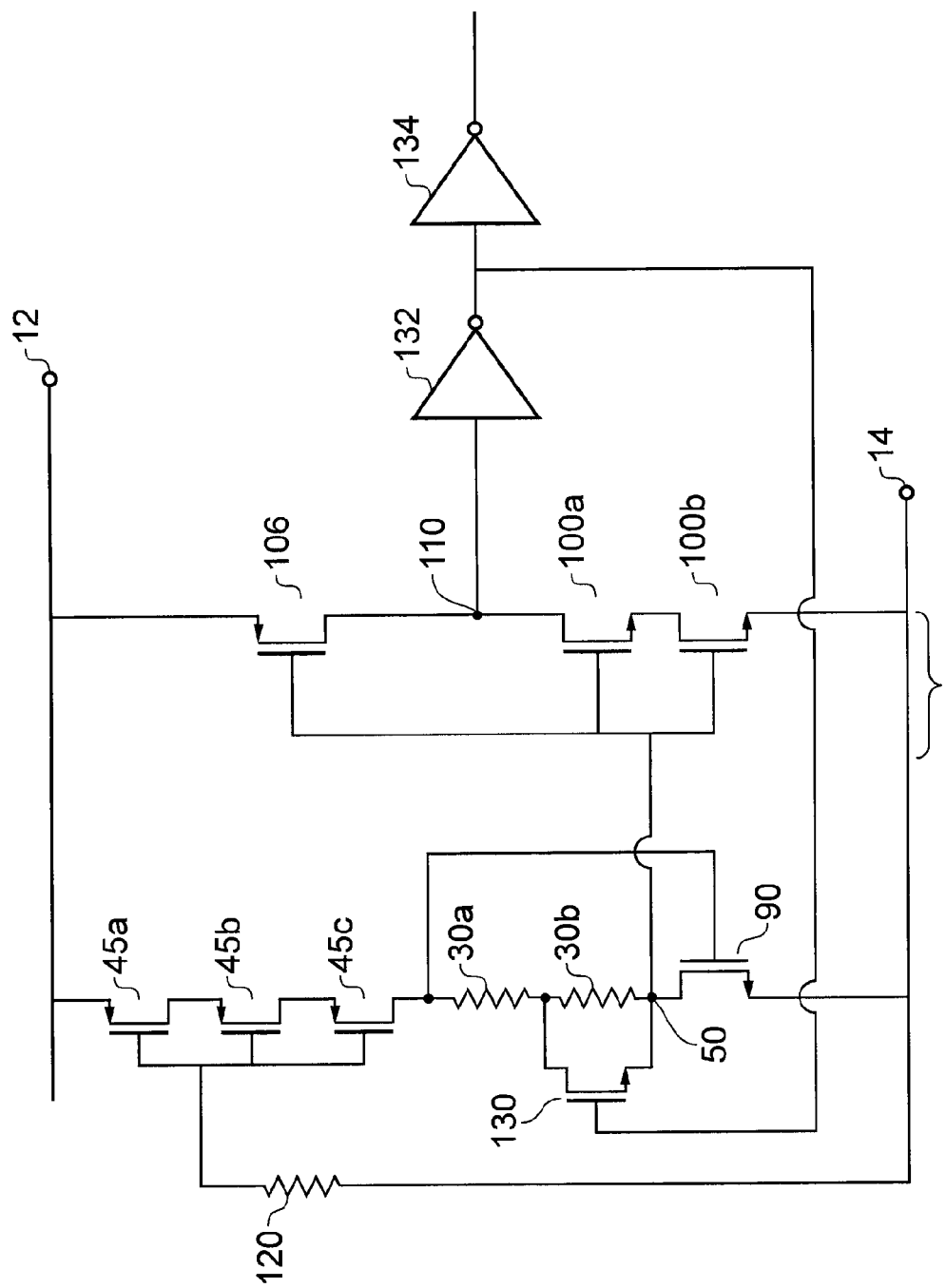
FIG. 5 shows a further modification to the arrangement shown in FIG. 4 so as to add hysteresis.

FIG. 5 shows an embodiment of the circuit of FIG. 4 in greater detail. In FIG. 5 the second transistor 45 has been replaced by three series connected P-type transistors designated 45a, 45b and 45c. These transistors have their gates connected together and to the reference node 14 via pull down resistor 120.

In FIG. 5 the resistor 30 has been segmented into two resistors labeled 30a and 30b. The resistor 30b is in parallel with a shorting transistor 130 whose gate is connected to an output of a second inverter 132 whose input is connected to the output node 110 of the first inverter 60. One purpose of this arrangement is to change the value of the resistor 30 such that prior to asserting that the supply voltage has risen to its correct value the value of the resistor is formed by the sum of resistors 30a and 30b, which might for example be 3 MΩ and 1 MΩ respectively, whereas once the circuit has reached its trip voltage and the output at the output node 110 has become asserted (active low) then the inverter 132 acts to switch the shorting transistor 130 on such that the effective resistance is now reduced to that of resistor 30a, and consequently the trip point of the circuit changes. Thus hysteresis is introduced into the circuit so as to avoid the possibility of repeatedly sending a reset signal when the power supply voltage has only just reached the necessary minimum value. Other ways of achieving hysteresis are known to the person skilled in the art and may be used.

As illustrated in FIG. 5, the third transistor 100 of FIG. 4 can be implemented by two transistors 100a and 100b so as to further inhibit current flow down the circuit limb formed by the transistors 106, 100a and 100b once the power supply voltage has become established. The output of the power reset generator may further be inverted by a further inverter 134 if desired.

Figure 6:
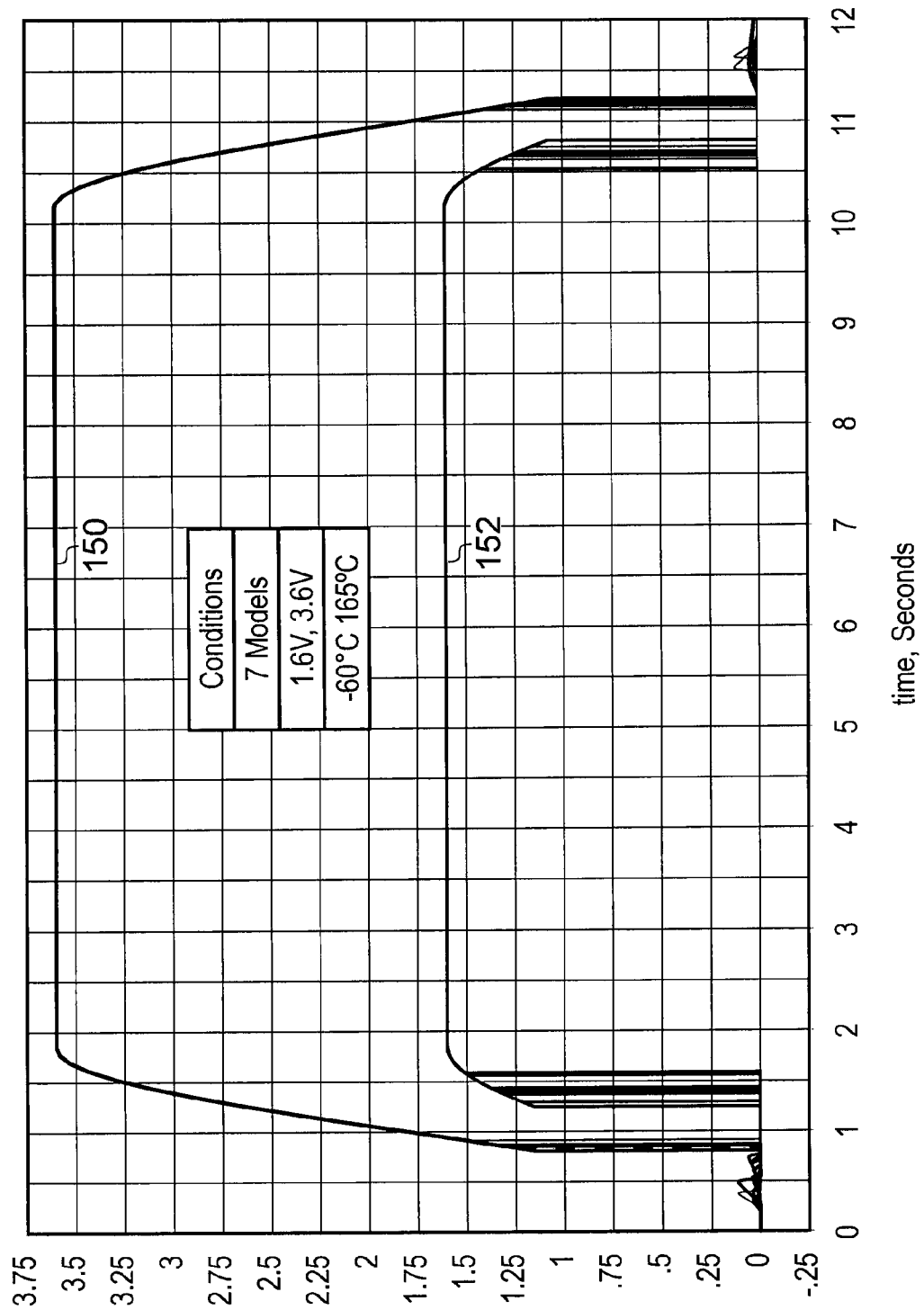
FIG. 6 is a graph showing trip voltage and evolution of voltage at a control node in response to changes in a power supply voltage.

FIG. 6 is a plot showing the performance of the power on monitoring circuit of FIG. 5 in response to a slowly varying supply voltage $V_{DD}$ as indicated by line 150, together with the evolution of the voltage at the drain of the first transistor 90 as represented by line 152. The circuit of FIG. 5 was arranged to have a trip point of typically 1.34 volts, but an acceptable range of between about 1.17 volts and 1.52 volts, with a hysteresis of between about 55 mV and 100 mV, and typically about 80 mV. The supply voltage initially started at zero and then a slow ramping commenced at about 0.75 seconds into the test such that the supply voltage ramped up to its nominal value of about 3.6 volts after a further second or so. The supply voltage was then held at about 3.6 volts until 10.25 seconds into the test and then slowly ramped down back to zero such that it reached zero by approximately 11.25 seconds into the test. This was repeated for seven test circuits between temperatures of −60 and +165° C. FIG. 6 shows that there was some temporal jitter in the power supply voltage 150, and that it rose from zero at slightly different times in the test, but roughly at between about 0.7 seconds to 0.9 seconds (about 0.8 seconds) into the test. The line 152 shows that the circuit tripped at voltages of between about 1.17 and 1.5 volts, with the output voltage at the drain of the first transistor 90 stabilizing at about 1.6 volts once the supply voltage had become established at about 3.6 volts. For a relatively simple, inexpensive, physically small and low power circuit the operating performance with respect to temperature is remarkably consistent, and certainly sufficient for the task of monitoring when the supply voltage has risen to approximately one half of its nominal voltage.

Figure 7:
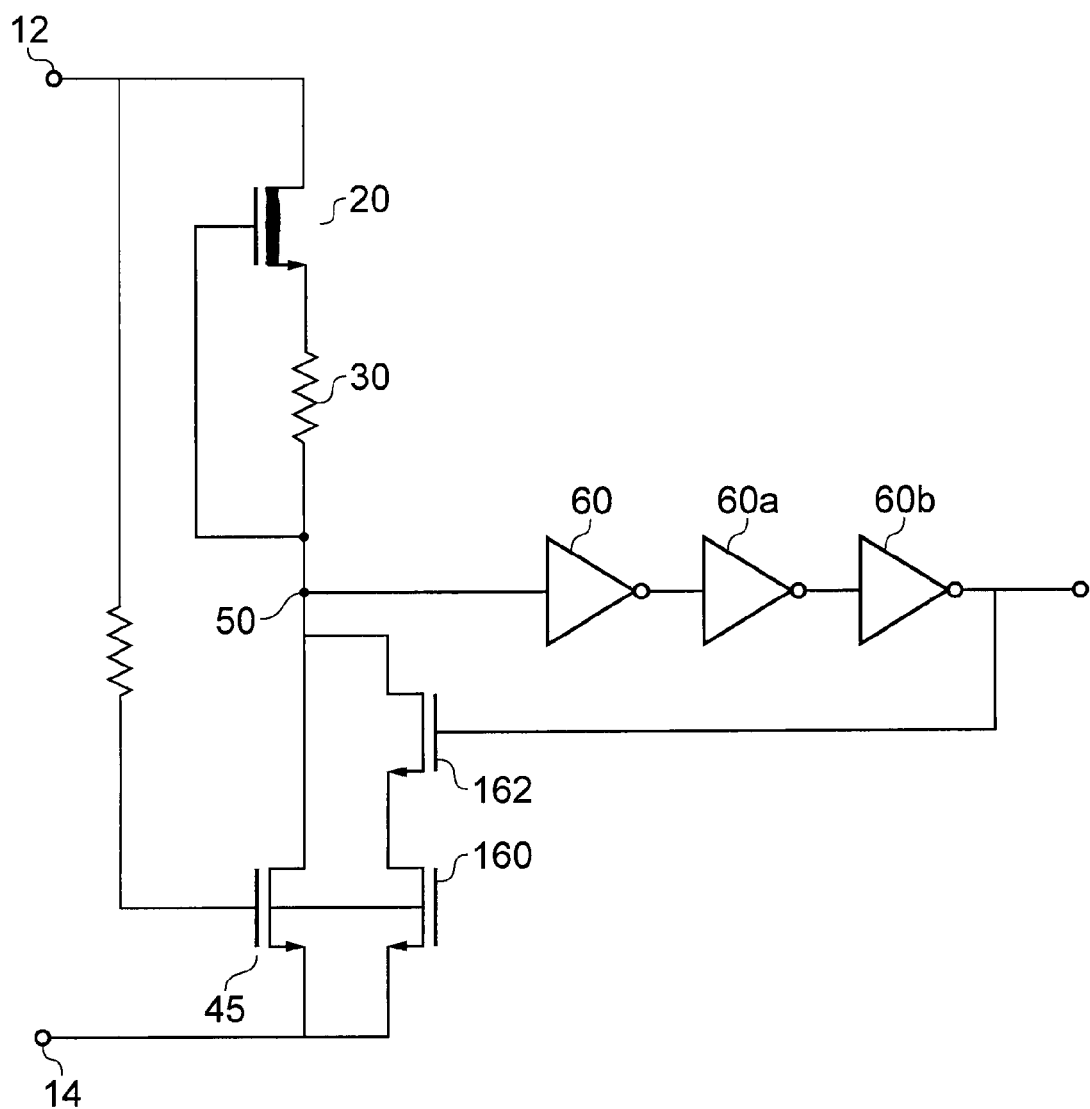
FIG. 7 is a circuit diagram of a further embodiment of a power on reset circuit which is a variation on the arrangement shown in FIG. 1b.

FIG. 7 shows a variation on the arrangement of FIG. 1b where hysteresis has been added by forming a further current path by providing an additional transistor 160 which may be similar to the second transistor 45, in the series with a transistor switch 162. The voltage at output node 50 is provided to a succession of three inverters 60, 60a and 60b with the output of inverter 60b serving both as the output of the power on monitoring circuit and also as the control signal to the gate of the transistor switch 162. Thus when the second transistor 45 becomes sufficiently conducting to drag the voltage at output node 50 low or at least below the inverter threshold, which is typically $V_{DD}/2$, then the inverter chain acts to switch transistor 162 fully on, thereby allowing increased current flow by opening the current flow path through transistor 160 in parallel to that of transistor 45. This acts to further reduce the voltage at the output node 50 thereby introducing hysteresis into the circuit.

Seven circuits were tested over a range of −60 to 165° C. and demonstrated a trip point of between about 1.56 volts and 1.74 volts with 1.63 volts being a typical tripping point. The hysteresis shown by these circuits was between 60 mV and 200 mV with 110 mV being typical.

The value of the first resistor 30 can be selected to be very large, for example 6 MΩ such that the current drawn by this circuit is well below 1 μA.

In modifications of the circuit the trip volt may be increased by, for example, connecting the source of the transistor 45 (or transistors 160 and 162) to the drain of a further diode connected N type transistor, such as an NMOS field effect transistor whose source is connected to the reference node 14.

Figures 8, 9:
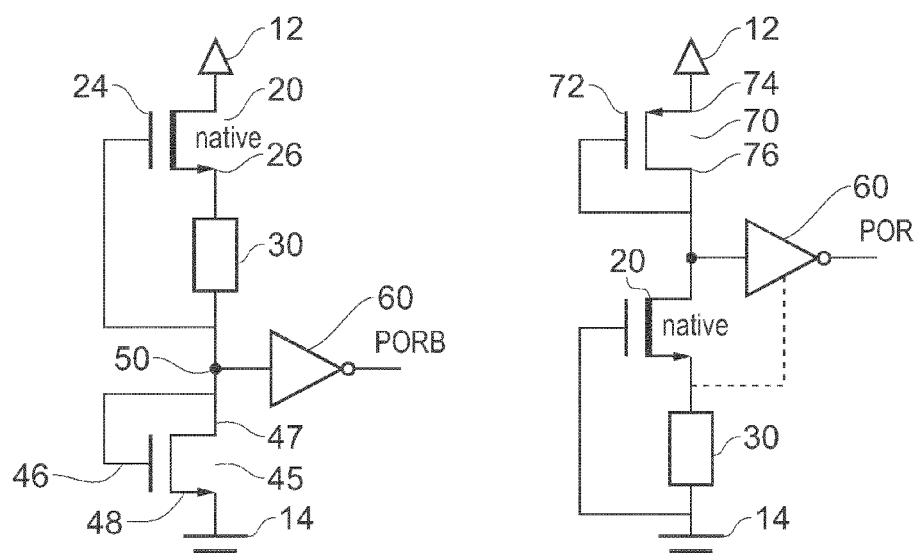
FIG. 8 shows a further embodiment of a power on reset circuit.
FIG. 9 shows a further embodiment of a power on reset circuit.

FIG. 8 shows a further example of a power on reset generator which is similar to that shown in FIG. 2. Similar parts are identified with like reference numerals. The illustrated first transistor 20 is a native device or a depletion mode device. The illustrated second transistor 45 is a diode connected enhancement mode device. As the supply voltage rises initially from zero volts, the second transistor 45 is substantially non-conducting whereas the first transistor 20 is conducting. As a result the node 50 follows the supply voltage and is "high", so the output of the inverter 60 is "low", maintaining a logic circuit in a reset condition.

As the supply voltage increases further, the second transistor 45 starts to conduct, and the voltage on node 50 becomes held substantially constant by the second transistor 45. Meanwhile the decision threshold of the inverter 60 continues to change with the charging supply voltage, and eventually the node 50 becomes "low" compared to the inverter's decision threshold, and the power on reset signal is released.

FIG. 9 shows a further embodiment which is a variation on the circuit as shown in FIG. 1d. Here the second transistor 70 has been configured in a diode connected arrangement, as was done with the circuit of FIG. 8.

Similar modifications can be made to the circuits of FIGS. 2b and 2d.

Furthermore, FIG. 9 also indicates that the "negative" supply rail 14 of the inverter 60 may be modified, and need not be connected to $V_{ss}$ or ground. An inverter was described with respect to FIG. 4. Applying that inverter circuit to FIG. 9, the source 101 of the third transistor 100 may be connected to the reference node 14, or alternatively it may be connected to the node between the first transistor 20 and the resistor 30. This can result in any current flow via transistor 100 during the reset flows via the resistor 30, tending to reduce current flow in the first transistor 20, and also modifying the switching threshold of the inverter 60, both of these actions tending to delay release of the reset signal. However, with such a current flow from the inverter 60, the resistor 30 may be made with a smaller electrical and physical size. This is significant as a large resistance value of the resistor 30 can cause it to be the largest component of the power up reset circuit, and hence a reduction is size of the resistor 30 can reduce the footprint and cost of the circuit.

Figure 10:
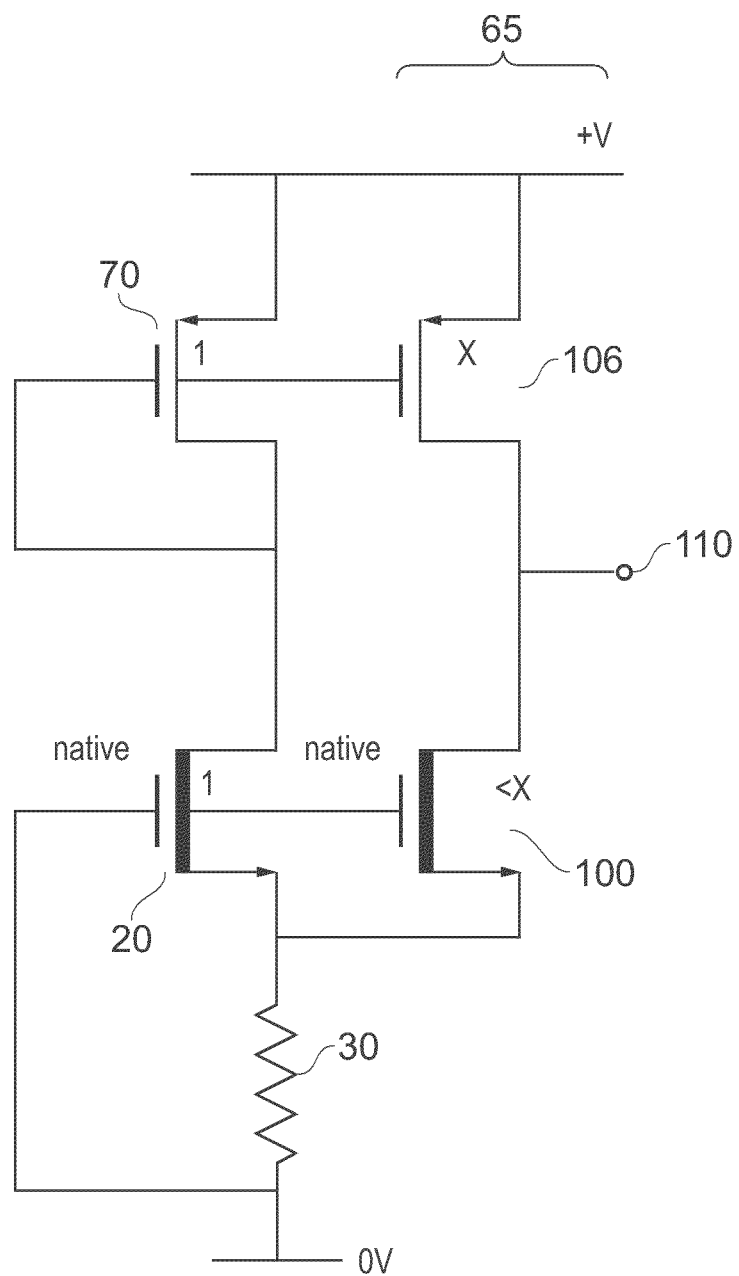
FIG. 10 shows another embodiment of a power on reset circuit.

FIG. 10 shows a variation of a power up reset circuit of FIG. 9 in which a modified output stage has been added. The output stage 65 is similar to the arrangement shown in FIG. 4, but with the gate of the transistor 100 (which can be regarded as a first output stage transistor) being connected to the gate of the first transistor 20, and both transistors 20 and 100 being formed as matched native devices. Therefore they form a current mirror. Similarly the P-type transistor 106 (which can be regarded as a second output stage transistor) has its gate connected to the gate of the second transistor 70, and they are formed as matched enhancement mode devices, but with a scaling factor of X (X>1) between the devices. The second transistor 70 functions as the master transistor for a current mirror with the transistor 106, and the first transistor 20 functions as the master transistor for a current mirror formed with the transistor 100. As transistors 20 and 70 are in series, and no other circuit elements are disposed between them as illustrated, then the same current flows in each of the illustrated first and second transistors 20 and 70, respectively, when both of these transistors are conducting. Transistor 100 mirrors current of the first transistor 20, and is subject to a current scaling of less than X.

In use, as the supply voltage builds, only the illustrated transistors 20 and 100 are significantly conducting, and hence the output node 100 is pulled towards 0V. As the supply voltage rises sufficiently to switch transistor 70 on, the transistor 106 also starts to conduct, but seeks to pass more current than the transistor 100 sinks. Thus the node 110 can get pulled towards the supply voltage as the supply stabilizes. Such an arrangement can deliver a reliable reset signal during the initial stages of establishing the power supply voltage.

The source of the transistor 100 can be connected to ground, or as shown here to the source of the first transistor 20. If a 1:1 current mirror is formed between transistors 20 and 100 then the size of the resistor 30 can be halved. If the transistor 100 is arranged to pass more current than the first transistor 20, then the size of the resistor 30 can be further reduced.

It should be noted that any of the diode connected transistors can be replaced by bipolar transistors, and hence transistors 70 and 106 of FIG. 10 could be matched PNP bipolar transistors forming a current mirror, for example.

Figures 11, 12:
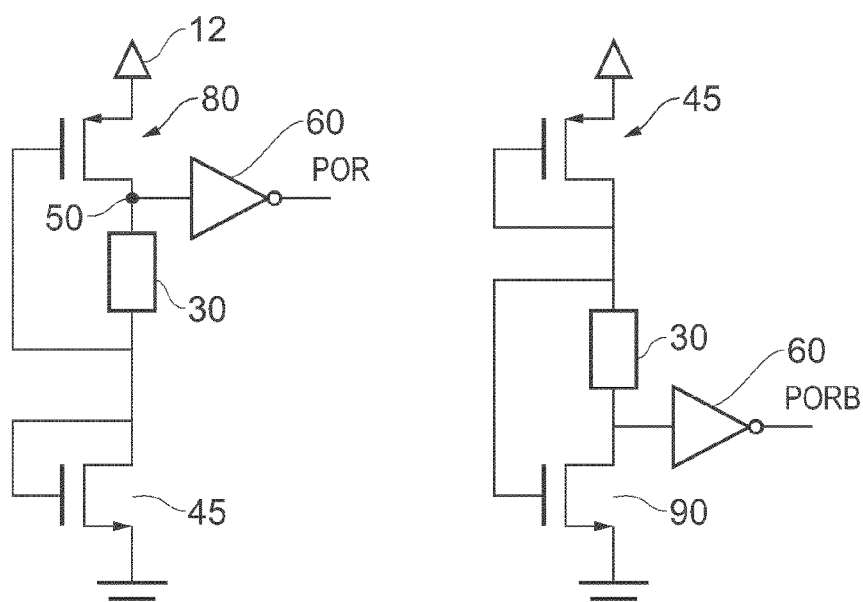
FIG. 11 shows a variation of the circuit shown in FIG. 2b.
FIG. 12 shows a variation of the circuit shown in FIG. 2d.

FIG. 11 shows a further embodiment which is similar to that shown in FIG. 2b, except that the second transistor 45, has its gate connected to its drain, rather than to the positive supply as was the case described with respect to FIG. 2b. However the operation of the circuit is similar to that described with respect to FIG. 2b.

FIG. 12 is similar to FIG. 2d, but the second transistor 45 is in a diode connected configuration, as opposed to having its gate tied to ground.

Figure 13:
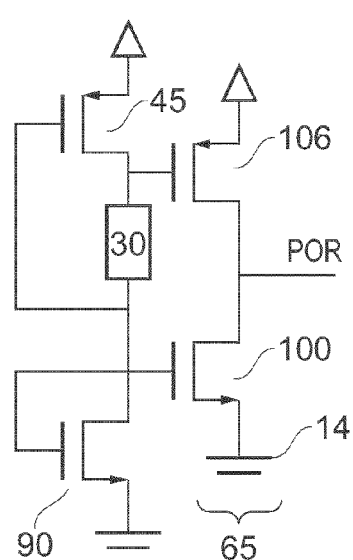
FIG. 13 shows a variation of the circuit shown in FIG. 11.
Figure 14:
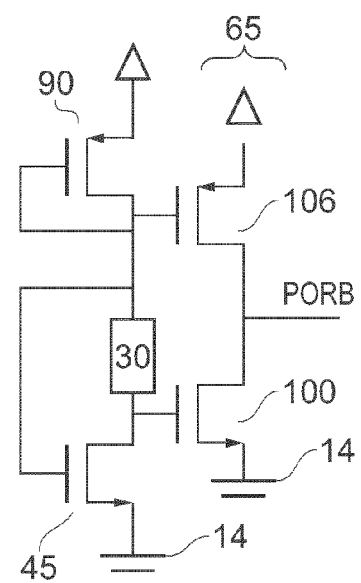
FIG. 14 shows a variation of the circuit shown in FIG. 12.

FIG. 13 repeats the circuit of FIG. 11, but explicitly shows connections to an output stage 65 as generally described with respect of FIG. 10, but with the source of the transistor 100 being connected to the 0V supply 14. Similarly FIG. 14 repeats the circuit of FIG. 12 but with the output stage 65 being redrawn to show the connections to the buffer transistors 100 and 106.

For simplicity in the embodiments described herein the first transistor 20, 80, or 90 and a first voltage dropping component (e.g., the resistor 30) can be thought of as forming a first stage of the circuit, and the second voltage dropping component (e.g., transistor 45 or 70 or second resistor 40) form a second stage of the circuit. A feature of the circuit is that the current from the first stage flows in the second stage. Thus the first and second stages are in current flow communication, which can be achieved by arranging the first and second stages in series, as shown in the accompanying figures. However this is not the only way of achieving this, and a current mirror may be used to mirror the current from the first stage into the second stage. Thus, in such arrangements the first and second stages can be regarded as being in parallel.

The various arrangements disclosed herein can be mixed in any suitable combination by the person skilled in the art.

It is thus possible to provide a self starting, inexpensive, small, robust and reasonably reliable power up monitoring circuit. The output of the circuit can, as discussed hereinbefore, be used to trigger a monostable to deliver a reset pulse. Alternatively, where the output of the circuit goes low, this may be capacitively coupled to a reset low pin of a logic circuit so as to temporarily pull the pin to a reset value. The reset low pin may be tied the $V_{DD}$ supply rail via a large value resistor in order to ensure that the reset is released after an appropriate period of time.

It will be appreciated that, by swapping N type for P type and vice versa, circuits to monitor the evolution of a negative voltage supply can also be implemented.

Although the claims presented here are in single dependency format, it is to be understood that any claim may depend on any preceding claim of the same type unless that is a clearly infeasible combination of features.

The circuits and methods for power monitoring and/or power up reset generation are described above with reference to certain embodiments. A skilled artisan will, however, appreciate that the principles and advantages of the embodiments can be used for any other systems, apparatus, or methods with a need for power monitoring and/or generating a power up reset signal.

Such systems, apparatus, and/or methods can be implemented in various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, precision instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

The teachings of the inventions provided herein can be applied to other systems, apparatus, and/or methods other than those described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods, systems, and apparatus described herein may be embodied in a variety of other forms. Furthermore, various omissions, substitutions and changes in the form of the methods, systems, and apparatus described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A power supply monitoring circuit for monitoring a voltage at a power supply node compared to a reference node, the power supply monitoring circuit comprising a first field effect transistor and first and second voltage dropping components arranged in current flow communication between the power supply node and the reference node and each having first and second nodes, and wherein:
   an output signal is taken from a connection made with the first field effect transistor;
   the first field effect transistor is an N-type transistor having a drain that is connected to the power supply node;
   the first voltage dropping component is a resistor having its first node connected to a source of the first field effect transistor and its second node is connected to a gate of the first field effect transistor;
   the second voltage dropping component is connected between the second node of the resistor and the reference node, wherein the second voltage dropping component is a second field effect transistor configured as an active resistor; and
   a third resistor is coupled between the power supply node and a gate of the second field effect transistor.

2. A power supply monitoring circuit as claimed in claim 1, in which the N-type transistor is configured to conduct a current between its drain and source when its gate is at about the same voltage as its source.

3. A power supply monitoring circuit for monitoring a voltage at a power supply node compared to a reference node, the power supply monitoring circuit comprising:
   a first field effect transistor;
   first and second voltage dropping components arranged in current flow communication between the power supply node and the reference node and each having first and second nodes; and
   an inverter comprising an inverter input node that is coupled to a drain of the first field effect transistor, the inverter also being coupled to a first resistor and using a source of the first field effect transistor as a negative power rail of the inverter;
and wherein:
   the first field effect transistor is a first N-type transistor;
   the second voltage dropping component is connected between the power supply node and the drain of the first field effect transistor; and
   the first voltage dropping component is a resistor having its first node connected to a source of the first field effect transistor and its second node connected to a gate of the first field effect transistor and the resistor is in current flow communication with the reference node.

4. A power supply monitoring circuit as claimed in claim 3 wherein:
   the second voltage dropping component is a second field effect transistor configured as an active resistor; and
   a third resistor is coupled between the power supply node and a gate of the second field effect transistor.

5. A power supply monitoring circuit as claimed in claim 3, in which the second voltage dropping component is the first.

6. A power supply monitoring circuit for monitoring a voltage at a power supply node compared to a reference node, the power supply monitoring circuit comprising:
   a P-type field effect transistor having a source, a gate, and a drain, wherein the source of the P-type field effect transistor is electrically connected to the power supply node;
   an N-type field effect transistor having a source, a gate, and a drain, wherein the source of the N-type field effect transistor is electrically connected to the reference node;

a resistor arranged in series between the drain of the P-type field effect transistor and the drain of the N-type field effect transistor; and an output stage comprising first and second series connected output stage transistors with an output node therebetween, one of the output stage transistors being a second N type field effect transistor and the other being a second P type field effect transistor and where a gate of the first output stage transistor and the gate of the second output stage transistor are connected to opposing nodes of the resistor;

wherein an output signal is taken from a connection made with an output field effect transistor;

wherein the output field effect transistor is either the P-type field effect transistor or the N-type field effect transistor; and wherein the resistor is electrically connected in series between the gate of the output field effect transistor and the drain of the output field effect transistor.

7. A power supply monitoring circuit as claimed in claim 6, in which the output field effect transistor is the P-type field effect transistor.

8. A power supply monitoring circuit as claimed in claim 6, wherein the gate of the P-type field effect transistor is coupled to a gate of the N-type field effect transistor.

9. A power supply monitoring circuit as claimed in claim 6, wherein the output signal is provided to an input to an inverter comprising a plurality of transistors that each has a gate, the output signal connected to each gate of the plurality of transistors of the inverter.

10. A power supply monitoring circuit as claimed in claim 1, where the output signal is provided to an input to an inverter.

11. A power supply monitoring circuit as claimed in claim 10, in which a decision or switching threshold of the inverter or comparator varies with the instantaneous value of the supply voltage.

12. A power supply monitoring circuit for monitoring a voltage at a power supply node compared to a reference node, the power supply monitoring circuit comprising a first field effect transistor and first and second voltage dropping components arranged in current flow communication between the power supply node and the reference node and each having first and second nodes, the power supply monitoring circuit further comprising a switch in parallel with at least part of the first voltage dropping element, the switch being responsive to the output of the power up circuit so as to provide hysteresis, and wherein:

a first node of the first voltage dropping component is connected to one of the first and second nodes of the first field effect transistor;

a gate of the first field effect transistor is connected to the second node of the first voltage dropping component; and an output signal is taken from a connection made with the first field effect transistor.

13. A power supply monitoring circuit as claimed in claim 1, wherein the first field effect transistor is a depletion mode transistor or a native transistor.

14. A power supply monitoring circuit as claimed in claim 3, in which the second voltage dropping component comprises a diode connected transistor.

15. A power supply monitoring circuit as claimed in claim 14, wherein the inverter comprises first and second series connected inverter stage transistors with an inverter output node therebetween, one of the inverter stage transistors being an N type device and the other being a P type device, and where a gate of the first inverter stage transistor is connected to the gate of the first field effect transistor, and where a gate of the second inverter stage transistor is connected to a gate of the diode connected transistor.

16. A power supply monitoring circuit for monitoring a voltage at a power supply node compared to a reference node, the power supply monitoring circuit comprising:

a first field effect transistor and first and second voltage dropping components arranged in current flow communication between the power supply node and the reference node and each having first and second nodes, and an output stage comprising first and second series connected output stage transistors with an output node therebetween, one of the transistors being an N type device and the other being a P type device, wherein a first node of the first voltage dropping component is connected to one of the first and second nodes of the first field effect transistor;

wherein a gate of the first field effect transistor is connected to the second node of the first voltage dropping component;

wherein the first output stage transistor is matched to the first transistor of the power supply monitoring circuit; and wherein the first output stage transistor is arranged in a current mirror configuration with the first transistor.

17. A power supply monitoring circuit as claimed in claim 16, further including a second transistor in the monitoring circuit and wherein the second output stage transistor is in a current mirror configuration with the second transistor.

18. A power supply monitoring circuit as claimed in claim 1, further comprising an output stage comprising first and second series connected output stage transistors with an output node therebetween, one of the output stage transistors being an N type device and the other being a P type device and where a gate of the first output stage transistor and the gate of the second output stage transistor are connected to opposing nodes of the first voltage dropping component.

19. A power supply monitoring circuit as claimed in claim 16, wherein:

the first series connected output stage transistor has a gate in connection with the first field effect transistor; and the first series connected output stage transistor and the first field effect transistor are of the same conductivity type.

20. A power supply monitoring circuit as claimed in claim 19, wherein:

the second voltage dropping component is a transistor;

the second voltage dropping component and the first field effect transistor have different conductivity types;

the second voltage dropping component has a connection with the second series connected output stage transistor; and the second voltage dropping component and the second series connected output stage transistor are of the same conductivity type.

21. A power supply monitoring circuit as claimed in claim 3, in which the first field effect transistor is a depletion mode transistor or a native transistor.

22. A power supply monitoring circuit as claimed in claim 7, wherein the gate of the N-type field effect transistor is connected to the power supply node.

23. A power supply monitoring circuit as claimed in claim 6, wherein the gate of the P-type field effect transistor is connected to the drain of the P-type field effect transistor such that the P-type field effect transistor is diode connected.

24. A power supply monitoring circuit as claimed in claim 6, wherein:
the second P-type field effect transistor has a source connected to the power supply node; and
the second N-type field effect transistor has a source connected to the reference node;
wherein a drain of the second N-type field effect transistor is connected to a drain of the second P-type field effect transistor; and
wherein the output signal is connected to either a gate of the second P-type field effect transistor or a gate of the second N-type field effect transistor.

25. A power supply monitoring circuit as claimed in claim 6, wherein a gate of the P-type field effect transistor is electrically connected to the resistor.

* * * * *

UNITED STATES PATENT AND TRADEMARK OFFICE
CERTIFICATE OF CORRECTION

PATENT NO. : 9,525,407 B2  
APPLICATION NO. : 14/204851  
DATED : December 20, 2016  
INVENTOR(S) : Santiago Iriarte Page 1 of 1

It is certified that error appears in the above-identified patent and that said Letters Patent is hereby corrected as shown below:

In Column 12 at Line 56, In Claim 5, change "first." to --first resistor.--.

Signed and Sealed this  
Eighteenth Day of April, 2017

Michelle K. Lee  
*Director of the United States Patent and Trademark Office*